United States Patent
Wecker

[11] Patent Number: 6,155,635
[45] Date of Patent: Dec. 5, 2000

[54] SOLAR ROOF FOR MOTOR VEHICLES

[75] Inventor: Reinhard Wecker, Eichenau, Germany

[73] Assignee: Wesbasto Karosseriesysteme GmbH, Stockdorf, Germany

[21] Appl. No.: 09/276,758

[22] Filed: Mar. 26, 1999

[30] Foreign Application Priority Data

Mar. 26, 1998 [DE] Germany .......................... 198 13 324

[51] Int. Cl.[7] .................................................. B60J 7/043
[52] U.S. Cl. ........................................................ 296/211
[58] Field of Search .................... 296/216.01, 216.04, 296/216.05, 216.09, 221, 211

[56] References Cited

U.S. PATENT DOCUMENTS

| | | |
|---|---|---|
| 5,149,351 | 9/1992 | Yaba et al. . |
| 5,154,481 | 10/1992 | Paetz et al. . |
| 5,248,278 | 9/1993 | Fuerst et al. . |
| 5,545,261 | 8/1996 | Ganz et al. .......................... 296/211 |

FOREIGN PATENT DOCUMENTS

| | | |
|---|---|---|
| 0 798 787 | 10/1997 | European Pat. Off. . |
| 35 38 986 | 5/1987 | Germany . |
| 37 13 854 | 10/1987 | Germany . |
| 38 30 484 | 3/1989 | Germany . |
| PCT/GB92/ 00457 | 3/1992 | WIPO . |

*Primary Examiner*—Gary C. Hoge
*Attorney, Agent, or Firm*—Nixon Peabody LLP; David S. Safran

[57] ABSTRACT

A solar roof for motor vehicles having a cover (10) with solar cells (22) which are located between an outside cover plate (20) and an inside covering (24), at least one power consumer which is supplied from the solar cells and which is separate from the solar cover (10), and a contact-making means for establishing an electrical connection between the solar cells (22) and the power consumer. The contact-making means has cover-side contacts (30) and roof-side contacts (42) which, at least in the closed solar cover end position, make an electrical connection between the solar cells and the power consumer. To make the cover-side contacts (30) as simple, space-saving and still reliable as possible, the cover-side are integrated within the solar cover (10).

15 Claims, 3 Drawing Sheets

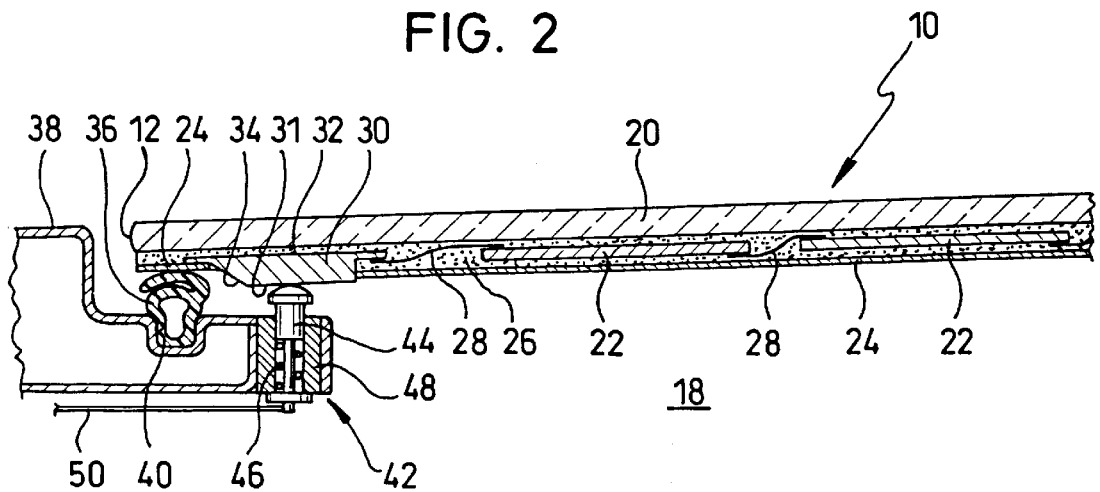
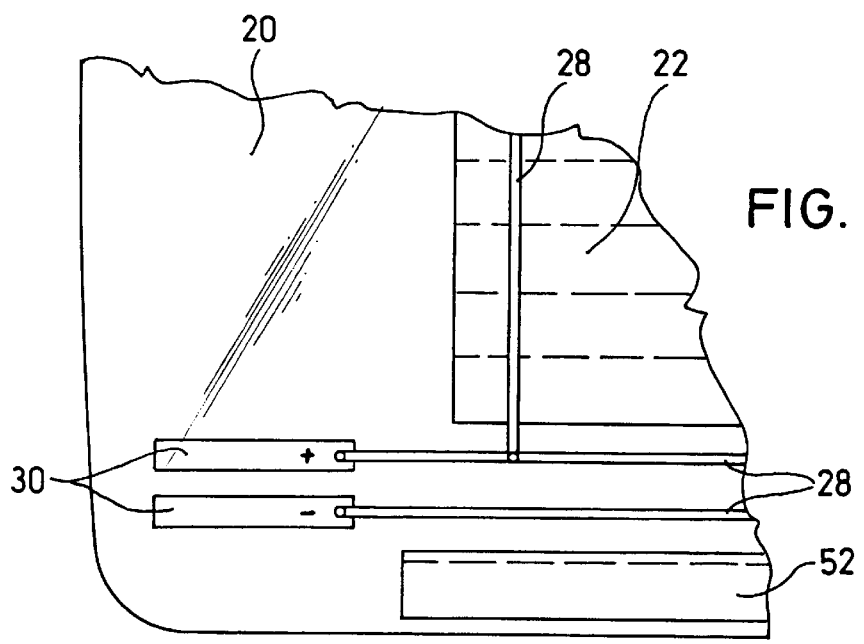

SOLAR ROOF FOR MOTOR VEHICLES

BACKGROUND OF THE INVENTION

1. Field of the Invention

The invention relates to a solar cover for selectively closing or partially exposing a roof opening in a motor vehicle having solar cells which are located between an outside cover plate and an inside covering, at least one power consumer supplied from the solar cells and separate from the solar cover, and with a contact-making means for establishing an electrical connection between the solar cells and the power consumer, the contact-making means having cover-side and roof-side contacts which, at least in one solar cover position, make the electrical connection even if one edge of the solar cover is pivoted and slid over or under a fixed roof surface.

2. Description of Related Art

U.S. Pat. No. 5,154,481 discloses a solar cover of the indicated type in which a complex contact-making means establishes electrical contact between the power consumer and solar cells in the front cover end position and with the solar cover opened or partially opened interrupts electrical contact. In contrast, in the solar cover disclosed in published German Patent Application DE 38 30 484 A1, the contact-making means is made such that electrical contact between the power consumer and solar cells is always ensured regardless of the position of the solar cover. It is common to these known solar covers that the attachment of the cover-side contacts to the solar cover is associated with considerable effort and is therefore cost-intensive.

U.S. Pat. No. 5,248,278 describes a fan roof for motor vehicles in which the cover is made in one embodiment as a solar cover which, depending on the position, electrically connects a cover-side contact plate to a spring contact attached to the frame of the cover to drive a fan blower. The cover-side contacts are attached subsequently in this known solar cover on an inside covering of the cover plate and are connected to the solar cells in an electrically conductive manner. To protect the electrical connection between the cover-side contacts and the solar cells against mechanical damage, it is necessary to additionally cover the connecting cables between their outlet site from the inside covering and the cover-side contacts in a suitable manner.

SUMMARY OF THE INVENTION

A primary object of the present invention is to devise a solar cover of the initially mentioned type in which the cover-side contacts are made as simply and in as space-saving a manner as possible and which will meet high demands for mechanical and electrical reliability.

This object is achieved by a solar cover with cover-side contacts which are integrated into the solar cover, and by the cover-side or roof-side contacts being made elastic with reference to their respective opposing contacts in the direction to the opposing contacts.

In the solar cover in accordance with the invention, due to the integration of the cover-side contacts into the solar cover, all electrical connections between the solar cells and the cover-side contacts are protected especially well against mechanical and corrosive stress, and the cover-side contacts do not take up any unnecessary structural space. In this case, at least the cover-side or the roof-side contacts of the solar cover are made elastic with reference to their respective opposing contacts in the direction toward them, it being preferably provided that the contacts which are made elastic have an elastically prestressed plunger or spring contact and the opposing contacts have a nonresilient contact area. In this way, reliable contact is also ensured when the rear edge of the solar cover is pivoted or otherwise displaced from the seal of the cover edge.

In another embodiment of the solar cover, the nonresilient contact areas form current busses which remain in electrical contact with the elastically prestressed plungers or spring contacts of the elastically made contacts during the entire opening path of the solar cover.

The solar cover can, in particular, be made such that, when the solar cover is opened or partially opened, the cover-side and the roof-side contacts break the electrical connection between the power consumer and the solar cells. In this embodiment, advantageously, the cover-side contacts are located in the vicinity of the front edge of the cover plate and have a nonresilient contact area which is essentially in contact with the elastically made roof-side contacts only in the front end position of the solar cover. The cover-side contacts can be combined in a common contact plate which preferably comprises a stabilization body to which the cover-side contacts are applied.

To keep mechanical wear low in the opening and closing of the contacts, at least one of the contacts can have feed ramps which take effect in one displacement direction of the solar cover.

The cover-side contacts can be integrated with high mechanical safety in the solar cover and the solar cover can be implemented with especially low structural height when the cover-side contacts are adhesively joined to the cover plate.

Preferably, for the inner covering, a plastic film is used which, in the area of the cover-side contacts, has recesses. In this way, after completion of the lamination process on the inner covering, in the area of the cover-side contacts, post-finishing is unnecessary.

Preferably, in the lamination process, the cover-side contacts are adhesively connected to the cover plate by means of the same embedding material which is used to embed the solar cells. Alternatively, it is also possible to apply an adhesive to the cover-side contacts which takes into account the requirements of the material pairing of the cover plate and the contacts and which sets during the lamination process.

If the solar cover is made with a plastic frame which is foamed on or injected on, in the edge area of the cover plate, the plastic frame can have recesses in the area of the cover-side contacts which are already attached in the foaming or injection process.

These and further objects, features and advantages of the present invention will become apparent from the following description when taken in connection with the accompanying drawings which, for purposes of illustration only, show several embodiments in accordance with the present invention.

BRIEF DESCRIPTION OF THE DRAWINGS

FIG. 2 is a partial section through the solar cover along line II—II of FIG. 1;

FIG. 3 is an enlarged representation of the corner area of the solar cover indicated with a circle III in FIG. 1;

DETAILED DESCRIPTION OF THE INVENTION

Figure 1:
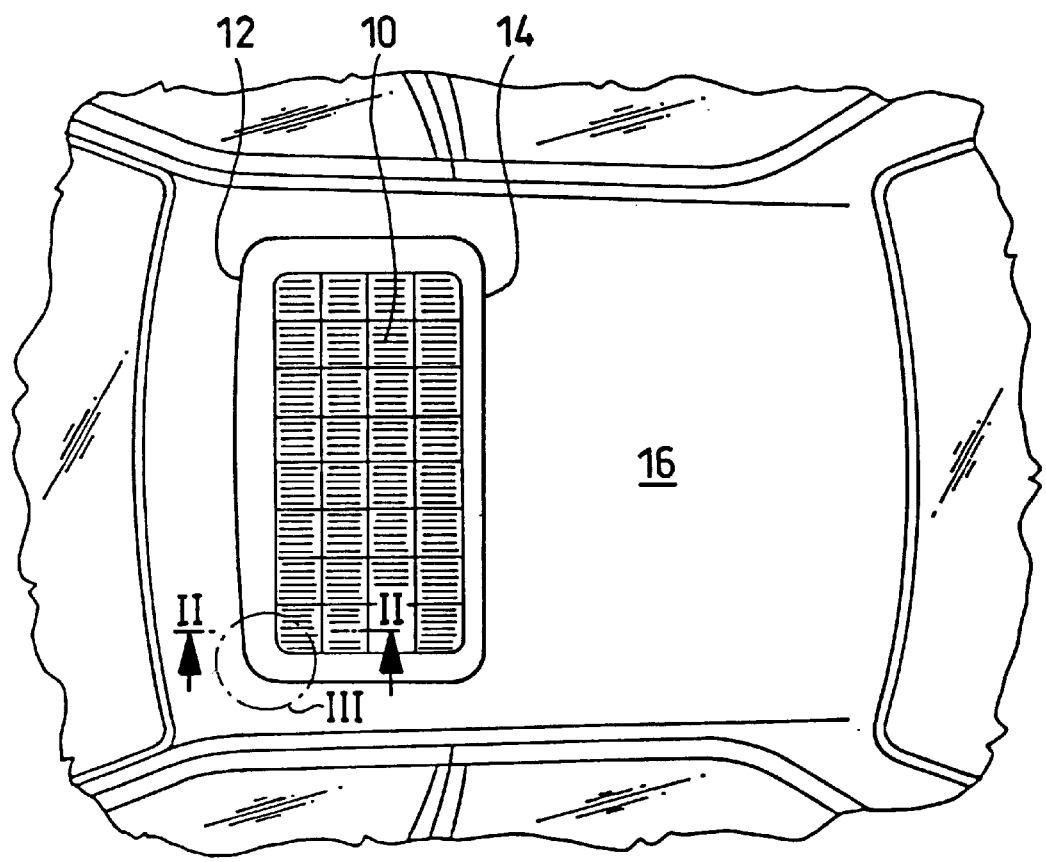
FIG. 1 is a plan view of a vehicle roof with a solar cover.

The embodiment of the solar cover 10 shown in FIGS. 1 to 3 is a frameless solar cover 10 which, as part of a conventional spoiler roof, can be raised at its rear edge 14 above a fixed roof skin 16 and can be pushed to the rear over the fixed roof skin 16. On its front edge 12, the solar cover 10 has two cover-side contacts 30, each of which is electrically connected via an intercell connector 28 to solar cells 22. The solar cells 22 are likewise connected via the intercell connectors 28 and are embedded in a soft embedding material 26 between an outer cover plate 20 and an inner covering 24. As the embedding material 26, for example, a hot-melt cement, a casting resin or a transparent adhesive tape can be used. The outer cover plate 20 is preferably a glass plate, but can also be a plastic plate, for example, one made of plexiglass. For the inner covering 24, preferably, a plastic film is used, but alternatively glass or a metal, especially aluminum, can be used.

The cover-side contacts 30 are produced from a suitable contact material, for example, brass or galvanized copper, and on their side facing the front edge 12 of the solar cover 10, they have a run-up ramp 34 which, in the direction toward the front edge 12, adjoins a flattened area that is covered by the covering 24. The contacts 30 are attached adhesively to the cover plate 20 via their rear sides 32 by means of the embedding material 26, and on their ends facing away from the run-up ramp 34, have a shoulder which is made as a solder lug and which is used for electrical coupling of the intercell connectors 28. Between the feed lamp 34 and the solder lug there is a contact area 31 which runs essentially parallel to the cover plate 20.

In a roof frame 38, there is a peripheral cover edge seal 36 in a groove 40. Two elastic roof-side contacts 42 are fixed via an insert body 48 in the frame 38. Electrical contact with each of the two cover-side contacts 30 is established via a respective plunger 44 which is provided with a rounded contact surface and which is held resiliently in an insulating insert body 48 such that, with the solar cover 10 closed, the plungers 44 are prestressed by a spring 46 essentially perpendicularly with reference to the contact area 31 of the cover-side contact 30. Even if the solar cover 10 is moved into a ventilating position by raising the rear edge 14 of the solar cover 10 above the fixed roof skin 16, its front edge 12 remaining essentially in the position shown in FIG. 2, it is ensured that the elastic plungers 44 maintain a reliable electrical connection to the roof-side contacts 30. A power consumer or collector 49 (FIG. 6), for example, a fan blower or an onboard battery, is connected electrically via electrical cables 50 to the roof-side contacts 42.

When the solar cover 10 is opened, it is moved from the closed position shown in FIG. 2, as described above, first into the ventilating position, and then, is pushed in a rearward direction of travel, i.e., to the right in FIG. 2. In doing so, the plungers 44 slide, first of all, on the contact areas 31 of the cover-side contacts 30, then follow the run-up ramps 34 in the direction toward the cover plate 20 as the springs 46 are relieved, and finally, before they reach inside cover 24, they are fixed in their extended end position by a retaining device (not shown). The electrical connection between the power consumer and solar cells is interrupted starting with the opening path of the solar cover defined thereby. When the solar cover 10 is closed, as the described progression is reversed, electrical contact is re-established, the run-up ramps 34 of the cover-side contacts again interacting with the rounded contact surfaces of the plungers 44. The combination of the rounded contact surfaces and disengagement thereof from contact with the cover 10 serves to reduce wear.

Figure 6:
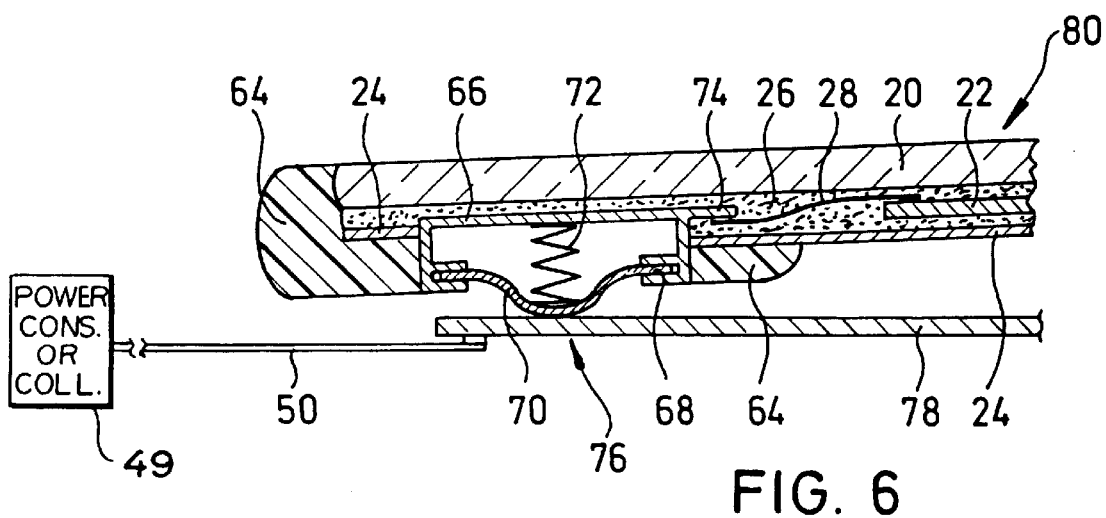
FIG. 6 shows a partial section similar to FIG. 2 for a solar cover according to a modified embodiment.

In the enlarged plan view shown of FIG. 3, on the front corner area of the solar cover 10, as well as in the sections shown in FIGS. 2 and 6, for clearer illustration, the enamel layer or so-called frit is not shown, with which the inside of the cover plate 20 is provided in a conventional manner, essentially in the edge area and in the area of the intercell connectors 28, in order to optically cover the components which lie under the frit. An inner cover sheet 52 is cemented on both sides of the solar cover 10 onto the inner covering 24 and can additionally be fixed with screws which penetrate the cover plate 20. Connected to the inner cover sheet 52 is an displacement mechanism (not shown) and which is designed in a conventional manner in order to displace the solar cover 10 and move it into its ventilating position.

Figure 4:
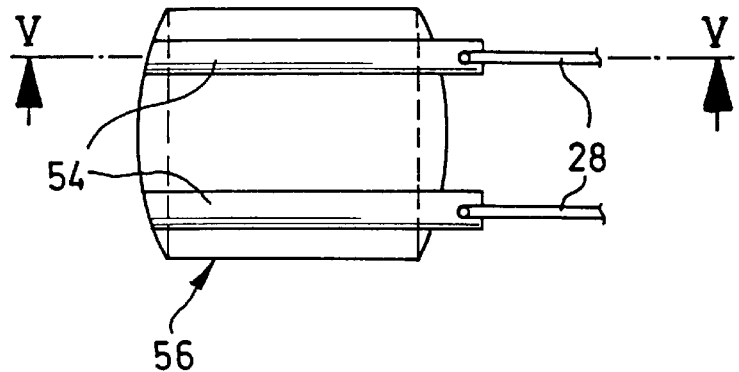
FIG. 4 is a plan view of a modified embodiment of the cover-side contacts.
Figure 5:
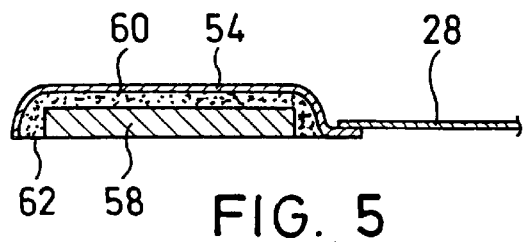
FIG. 5 shows a section through the contact along line V—V of FIG. 4.

In the modified embodiment of the cover-side contacts shown in FIGS. 4 & 5, two contact strips 54 are combined into a contact plate, labeled 56 as whole, and are connected to a stabilization plate 58, for example, a glass fiber reinforced plastic plate. Fixing of the cover-side contacts 54, made as sheet metal strips, is effected by means of an embedding material 60 in a lamination process. The contact strips 54 of the contact plate 56 prepared in this way are brought into electrical contact with the solar cells 22 via the intercell connectors 28, and then, jointly with the solar cells 22, are laminated onto the cover plate 20, the back 62 of the contact plate 56 being adhesively connected via the embedding material 26 to the cover plate 20.

FIG. 6 shows a modified embodiment of a solar cover 80 in which the same components are labeled with the same reference numbers as in the embodiment shown in FIGS. 1 to 3. The solar cover 80 differs from the solar cover 10 described above essentially in that the cover-side and roof-side contacts are in electrical contact not only in the front end position of the solar cover 80, i.e., they maintain electrical contact in any position of the solar cover 80, thus even when the solar cover 80 is opened or partially opened. To do this, in the solar cover 80, in the vicinity of its front edge, the two cover-side contacts 76 are made to be resiliently deflectable and on the roof side there are two current busses 78 which extend over the entire opening path of the solar cover 80 and are connected to at least one power consumer or collector 49 via electric cables 50. This embodiment with current busses is especially suited for spoiler roofs or above-ridge, sliding roofs in which the cover is always fully exposed to the sun, as contrasted with sliding roofs where the cover is hidden under the rear area of the fixed roof skin in the open position.

The two cover-side contacts 76 each have a roughly U-shaped housing 66 with two receiving grooves 68 and a projection 74 which is made as a solder lug for soldering on the intercell connectors 28. The receiving grooves 68 are used to hold a spring contact 70 which, for its part, is reinforced in its spring action by a spring which is held in the housing 66 in a prestressed condition between the rear wall of the housing and the spring contact 70.

In contrast to the frameless solar cover 10, the solar cover 80 is a peripherally foamed solar cover with a plastic frame 64 which is foamed on in the edge area of the cover plate 20 and which has recesses in the area in which the cover-side contacts 76 are mounted. The solar cover 80 is part of a conventional lifting and sliding roof so that its rear edge can be raised above the fixed roof skin 16 and can be pushed rearward over the fixed roof skin 16. A likewise conventional displacement mechanism is joined to lateral inner cover sheets (not shown) and which, in contrast to the frameless solar cover 10, are not cemented to the inside covering 24 and when necessary screwed to the cover plate 20, but instead are foamed into the plastic frame 64 in a conventional manner.

I claim:

1. Solar roof having a cover for selectively closing and at partially exposing a roof opening in a fixed roof skin of a motor vehicle, comprising an outer cover plate, an inner covering, solar cells which are located between the outer cover plate and the inner covering, at least one power consumer or collector which is supplied with power from the solar cell and which is separate from the solar cover, and a contact-making means for establishing an electrical connection between the solar cells and the power consumer or collector, the contact-making means having both cover-side and roof-side contacts which are disposed in opposition to each for making an electrical connection in at least one position of the solar cover even when an edge of the solar cover is raised or lowered relative to the fixed roof skin; wherein the cover-side contacts are integrated within the solar cover, being mounted between the outer cover plate and the inner covering, and projecting beyond said inner covering toward the roof-side contacts; and wherein one of the cover-side and roof-side contacts is resiliently displaceable with reference to the other of the roof-side and cover-side contacts in a direction toward and away therefrom.

2. Solar roof as claimed in claim 1, wherein the contacts that are resiliently displaceable comprise elastically prestressed plungers and the other contacts have a nonresilient contact area.

3. Solar roof having a cover for selectively closing and at partially exposing a roof opening in a fixed roof skin of a motor vehicle, comprising an outer cover plate, an inner covering, solar cells which are located between the outer cover plate and the inner covering, at least one power consumer or collector which is supplied with power from the solar cell and which is separate from the solar cover, and a contact-making means for establishing an electrical connection between the solar cells and the power consumer or collector, the contact-making means having both cover-side and roof-side contacts which are disposed in opposition to each for making an electrical connection in at least one position of the solar cover even when an edge of the solar cover is raised or lowered relative to the fixed roof skin; wherein the cover-side contacts are integrated within the solar cover; wherein one of the cover-side and roof-side contacts is resiliently displaceable with reference to the other of the roof-side and cover-side contacts in a direction toward and away therefrom; wherein the contacts that are resiliently displaceable comprise elastically prestressed plungers and the other contacts have a nonresilient contact area; and wherein the nonresilient contact areas are formed by current busses which remain in electrical contact with the elastically prestressed plungers during an entire opening path of the solar cover.

4. Solar roof as claimed in claim 1, wherein the contacts that are resiliently displaceable comprise spring contacts and the other contacts have a nonresilient contact area.

5. Solar roof having a cover for selectively closing and at partially exposing a roof opening in a fixed roof skin of a motor vehicle, comprising an outer cover plate, an inner covering, solar cells which are located between the outer cover plate and the inner covering, at least one power consumer or collector which is supplied with power from the solar cell and which is separate from the solar cover, and a contact-making means for establishing an electrical connection between the solar cells and the power consumer or collector, the contact-making means having both cover-side and roof-side contacts which are disposed in opposition to each for making an electrical connection in at least one position of the solar cover even when an edge of the solar cover is raised or lowered relative to the fixed roof skin; wherein the cover-side contacts are integrated within the solar cover; wherein one of the cover-side and roof-side contacts is resiliently displaceable with reference to the other of the roof-side and cover-side contacts in a direction toward and away therefrom; wherein the contacts that are resiliently displaceable comprise spring contacts and the other contacts have a nonresilient contact area; wherein the nonresilient contact area of said contacts are formed by current busses which remain in electrical contact with the spring contacts throughout a path of opening movement of the solar cover.

6. Solar roof as claimed in claim 1, wherein the cover-side and the roof-side contacts are constructed and arranged to break the electrical connection between the power consumer or collector and the solar cells when the solar cover is rearwardly displaced for at least partially exposing the roof opening.

7. Solar roof as claimed in claim 6, wherein said one of the contacts that are resiliently displaceable is the roof-side contacts; and wherein the cover-side contacts are located in a vicinity of a front edge of the cover plate and have a nonresilient contact area which is in contact with the roof-side contacts only in a forward end position of the solar cover.

8. Solar roof having a cover for selectively closing and at partially exposing a roof opening in a fixed roof skin of a motor vehicle, comprising an outer cover plate, an inner covering, solar cells which are located between the outer cover plate and the inner covering, at least one power consumer or collector which is supplied with power from the solar cell and which is separate from the solar cover, and a contact-making means for establishing an electrical connection between the solar cells and the power consumer or collector, the contact-making means having both cover-side and roof-side contacts which are disposed in opposition to each for making an electrical connection in at least one position of the solar cover even when an edge of the solar cover is raised or lowered relative to the fixed roof skin; wherein the cover-side contacts are integrated within the solar cover; and wherein one of the cover-side and roof-side contacts is resiliently displaceable with reference to the other of the roof-side and cover-side contacts in a direction toward and away therefrom; wherein the cover-side and the roof-side contacts are constructed and arranged to break the electrical connection between the power consumer or collector and the solar cells when the solar cover is rearwardly displaced for at least partially exposing the roof opening; wherein said one of the contacts that is resiliently displaceable is the roof-side contacts; wherein the cover-side contacts are located in a vicinity of a front edge of the cover plate and have a nonresilient contact area which is in contact with the roof-side contacts only in a forward end position of the solar cover; and wherein the cover-side contacts are combined in a common contact plate.

9. Solar roof as claimed in claim 8, wherein the contact plate comprises a stabilization plate to which the cover-side contacts are applied.

10. Solar roof as claimed in claim 1, wherein said other of the contacts has run-up ramps along which said one of the contacts is displaceable during longitudinal displacement of the solar cover.

11. Solar roof having a cover for selectively closing and at partially exposing a roof opening in a fixed roof skin of a motor vehicle, comprising an outer cover plate, an inner covering, solar cells which are located between the outer cover plate and the inner covering, at least one power consumer or collector which is supplied with power from the solar cell and which is separate from the solar cover, and a contact-making means for establishing an electrical connection between the solar cells and the power consumer or collector, the contact-making means having both cover-side and roof-side contacts which are disposed in opposition to each for making an electrical connection in at least one position of the solar cover even when an edge of the solar cover is raised or lowered relative to the fixed roof skin; wherein the cover-side contacts are integrated within the solar cover; wherein one of the cover-side and roof-side contacts is resiliently displaceable with reference to the other of the roof-side and cover-side contacts in a direction toward and away therefrom; and wherein the cover-side contacts are adhesively joined to the cover plate.

12. Solar roof having a cover for selectively closing and at partially exposing a roof opening in a fixed roof skin of a motor vehicle, comprising an outer cover plate, an inner covering, solar cells which are located between the outer cover plate and the inner covering, at least one power consumer or collector which is supplied with power from the solar cell and which is separate from the solar cover, and a contact-making means for establishing an electrical connection between the solar cells and the power consumer or collector, the contact-making means having both cover-side and roof-side contacts which are disposed in opposition to each for making an electrical connection in at least one position of the solar cover even when an edge of the solar cover is raised or lowered relative to the fixed roof skin; wherein the cover-side contacts are integrated within the solar cover; and wherein one of the cover-side and roof-side contacts is resiliently displaceable with reference to the other of the roof-side and cover-side contacts in a direction toward and away therefrom; further comprising a plastic frame which is molded on to an edge area of the cover plate and which has recesses in which the cover-side contacts are disposed.

13. Solar roof cover having a cover for selectively closing and at partially exposing a roof opening in a fixed roof skin of a motor vehicle, comprising an outer cover plate, an inner covering, solar cells which are located between the outer cover plate and the inner covering, at least one power consumer or collector which is supplied with power from the solar cell and which is separate from the solar cover, and a contact-making means for establishing an electrical connection between the solar cells and the power consumer or collector, the contact-making means having both cover-side and roof-side contacts which are disposed in opposition to each for making an electrical connection in at least one position of the solar cover even when an edge of the solar cover is raised or lowered relative to the fixed roof skin; wherein the cover-side contacts are integrated within the solar cover; wherein one of the cover-side and roof-side contacts is resiliently displaceable with reference to the other of the roof-side and cover-side contacts in a direction toward and away therefrom; and wherein the inside covering comprises a plastic film which has openings in the area of the cover-side contacts.

14. Solar roof having a cover for selectively closing and at partially exposing a roof opening in a fixed roof skin of a motor vehicle, comprising an outer cover plate, an inner covering, solar cells which are located between the outer cover plate and the inner covering, at least one power consumer or collector which is supplied with power from the solar cell and which is separate from the solar cover, and a contact-making means for establishing an electrical connection between the solar cells and the power consumer or collector, the contact-making means having both cover-side and roof-side contacts which are disposed in opposition to each for making an electrical connection in at least one position of the solar cover even when an edge of the solar cover is raised or lowered relative to the fixed roof skin; wherein the cover-side contacts are integrated within the solar cover; wherein one of the cover-side and roof-side contacts is resiliently displaceable with reference to the other of the roof-side and cover-side contacts in a direction toward and away therefrom; and wherein said one of the contacts that are resiliently displaceable is the roof-side contacts; and said direction is substantially perpendicular to the fixed roof skin.

15. Solar roof having a cover for selectively closing and at partially exposing a roof opening in a fixed roof skin of a motor vehicle, comprising an outer cover plate, an inner covering, solar cells which are located between the outer cover plate and the inner covering, at least one power consumer or collector which is supplied with power from the solar cell and which is separate from the solar cover, and a contact-making means for establishing an electrical connection between the solar cells and the power consumer or collector, the contact-making means having both cover-side and roof-side contacts which are disposed in opposition to each for making an electrical connection in at least one position of the solar cover even when an edge of the solar cover is raised or lowered relative to the fixed roof skin; wherein the cover-side contacts are integrated within the solar cover; wherein one of the cover-side and roof-side contacts is resiliently displaceable with reference to the other of the roof-side and cover-side contacts in a direction toward and away therefrom; and wherein said one of the contacts that are resiliently displaceable is the cover-side contacts; and said direction is substantially perpendicular to the cover plate.

* * * * *